United States Patent
Kao et al.

(10) Patent No.: US 9,153,936 B2
(45) Date of Patent: Oct. 6, 2015

(54) POWER-EFFICIENT HIGH-SPEED DRIVER FOR A VERTICAL-CAVITY SURFACE-EMITTING LASER

(71) Applicant: Fujitsu Limited, Kawasaki-shi, Kanagawa (JP)

(72) Inventors: Tony Shuo-Chun Kao, Sunnyvale, CA (US); Nikola Nedovic, San Jose, CA (US)

(73) Assignee: Fujitsu Limited, Kawasaki-shi (JP)

( * ) Notice: Subject to any disclaimer, the term of this patent is extended or adjusted under 35 U.S.C. 154(b) by 0 days.

(21) Appl. No.: 13/922,793

(22) Filed: Jun. 20, 2013

(65) Prior Publication Data
US 2014/0376582 A1 Dec. 25, 2014

(51) Int. Cl.
*H01S 5/042* (2006.01)
*H01S 5/026* (2006.01)
*H01S 5/062* (2006.01)
*H01S 5/183* (2006.01)

(52) U.S. Cl.
CPC ............. *H01S 5/0427* (2013.01); *H01S 5/0261* (2013.01); *H01S 5/042* (2013.01); *H01S 5/06226* (2013.01); *H01S 5/183* (2013.01)

(58) Field of Classification Search
CPC ....... H01S 5/183; H01S 5/042; H01S 5/0261; H01S 5/06; H01S 5/0427; H01S 5/06226

USPC .................. 372/38.02, 38.07, 50.124, 29.011
See application file for complete search history.

(56) References Cited

U.S. PATENT DOCUMENTS

| 6,587,489 B2 | 7/2003 | Schrödinger | |
|---|---|---|---|
| 6,980,575 B1 | 12/2005 | Rohilla | |
| 2011/0019706 A1* | 1/2011 | Moto et al. ................. | 372/38.02 |
| 2012/0213237 A1* | 8/2012 | MacTaggart ............... | 372/38.02 |

OTHER PUBLICATIONS

Kucharski et al.; "A 20Gb/s VCSEL Driver with Pre-Emphasis and Regulated Output Impedence in 0.13μm CMOS"; ISSCC 2005, Optical Communications, Session 12; pp. 3.
Schow et al.; "A 24-Channel, 300 Gb/s, 8.2 pJ/bit, Full-Dulpex Fiber-Coupled Optical Transceiver Module Based on a Single "Holey" CMOS IC"; Journal of Lightwave Technology; vol. 29, No. 4; pp. 542-553, Feb. 15, 2011.

* cited by examiner

*Primary Examiner* — Armando Rodriguez
(74) *Attorney, Agent, or Firm* — Baker Botts L.L.P.

(57) ABSTRACT

An optical transmitter is disclosed. In accordance with some embodiments of the present disclosure, an optical transmitter may comprise a vertical-cavity surface-emitting laser (VCSEL) and a VCSEL driver. The VCSEL driver may comprise an input stage configured to receive a voltage signal and a low-impedance output stage comprising an input coupled to the input stage and a low-impedance output coupled to the VCSEL and configured to provide a modulated output current to the VCSEL.

23 Claims, 5 Drawing Sheets

POWER-EFFICIENT HIGH-SPEED DRIVER FOR A VERTICAL-CAVITY SURFACE-EMITTING LASER

TECHNICAL FIELD

The present disclosure relates generally to electrical circuits and, more particularly, to drivers for vertical-cavity surface-emitting lasers.

BACKGROUND

As computers and communication devices become ever faster and the demand for communication bandwidth increases, there is a corresponding desire to increase the speed of connections between the components used in such devices to enable the devices to achieve the desired speed and bandwidth. Conventional electronic circuits are unable to achieve data speeds between components greater than about 10 Gbps over any appreciable distance. Accordingly, increasing attention is being directed to optical communication.

Optical signaling is an alternative to electrical signaling for high-speed communication links. Vertical-cavity surface-emitting lasers (VCSEL) are typical light sources in high-speed optical links. The light produced by the VCSEL is coupled to an optical medium (e.g., fiber or waveguide) and sensed at the receiver by, for example, a photodiode (PD). A VCSEL-based optical communication link requires a VCSEL driver to modulate the power of a VCSEL during the communication of signals.

SUMMARY

An optical transmitter is disclosed. In accordance with one embodiment of the present disclosure, an optical transmitter may comprise a vertical-cavity surface-emitting laser (VCSEL) and a VCSEL driver. The VCSEL driver may comprise an input stage configured to receive a voltage signal and a low-impedance output stage comprising an input coupled to the input stage and a low-impedance output coupled to the VCSEL and configured to provide a modulated output current to the VCSEL.

In accordance with another embodiment of the present disclosure, a VCSEL driver may comprise an input stage configured to receive a voltage signal and a low-impedance output stage comprising an input coupled to the input stage and a low-impedance output configured to provide a modulated output current to a VCSEL when coupled to the VCSEL.

The object and advantages of the invention will be realized and achieved by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

A more complete and thorough understanding of the present embodiments and advantages thereof may be acquired by referring to the following description taken in conjunction with the accompanying drawings, in which like reference numbers indicate like features, and wherein.

DETAILED DESCRIPTION

Figure 1:
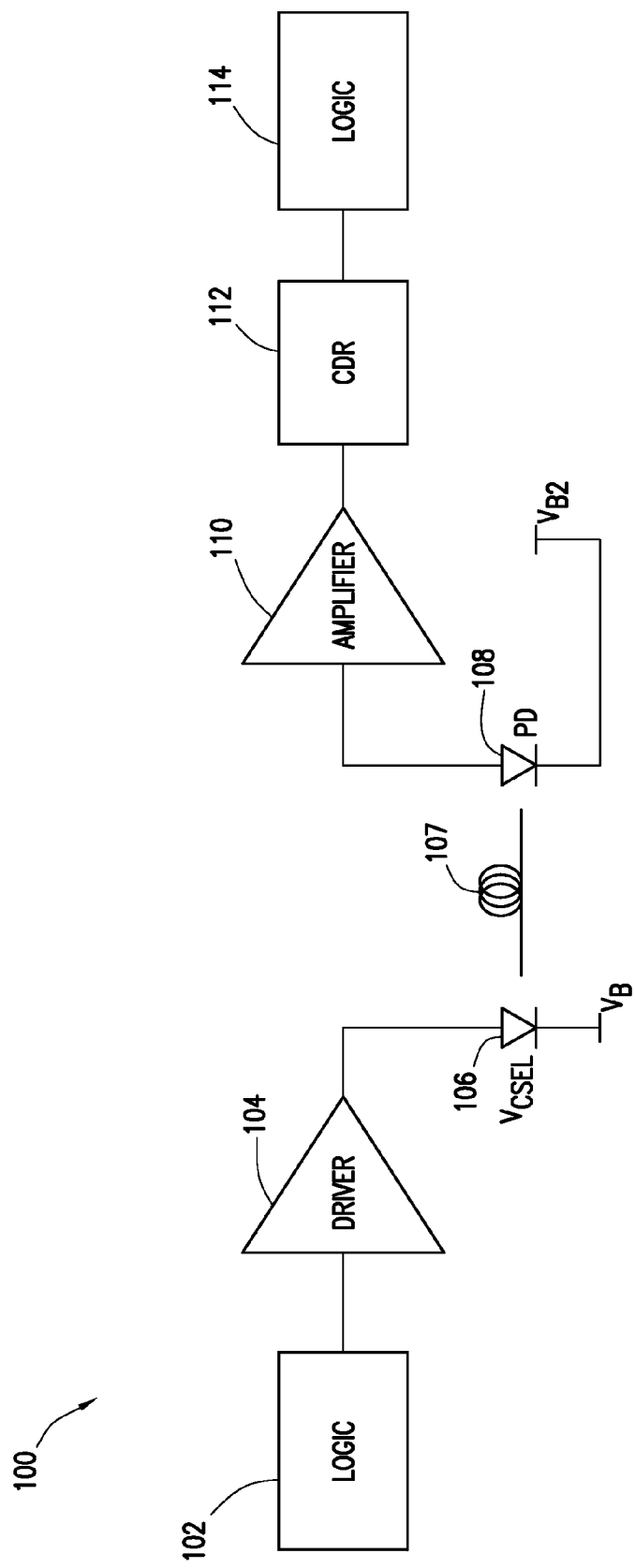
FIG. 1 illustrates a block diagram of an example high-speed optical link, in accordance with the teachings of the present disclosure.

FIG. 1 illustrates a block diagram of an example high-speed optical link 100, in accordance with the teachings of the present disclosure. High-speed optical link 100 may include logic blocks 102 and 114, a driver 104, a vertical-cavity surface-emitting laser (VCSEL) 106, an optical medium 107, a photodiode 108, an transimpedance amplifier 110, and a clock-and-data recover (CDR) circuit 112. VCSEL 106 may serve as the light source in high-speed optical link 100. In some embodiments, VCSEL 106 may reside in a transmitter and may be biased and modulated by driver 104. Accordingly, VCSEL 106 may transmit data from logic block 102 across optical medium 107. In some embodiments, optical medium 107 may be a fiber, a waveguide, or any other suitable medium configured to carry optical signals.

The light produced by VCSEL 106 may be sensed by receiver at an opposing end of optical medium 107. Such a receiver may include, for example, photodiode 108. Photodiode 108 may be configured to convert an optical signal to a current signal. In some embodiments, photodiode 108 may be coupled at its cathode to a bias voltage (e.g., $V_{B2}$ of two volts) sufficient to reverse bias photodiode 108. Photodiode 108 may be coupled at its anode to transimpedance amplifier 110, which may convert the current signal from photodiode 108 to a voltage signal. In turn, CDR circuit 112 may receive the voltage signal from transimpedance amplifier 110. In some embodiments, CDR circuit 112 may recover data that originated at logic block 102 from the voltage signal, as well as a clock signal that may have been embedded within such data. The data and embedded clock signal may in turn be processed by logic block 114.

Figure 2:
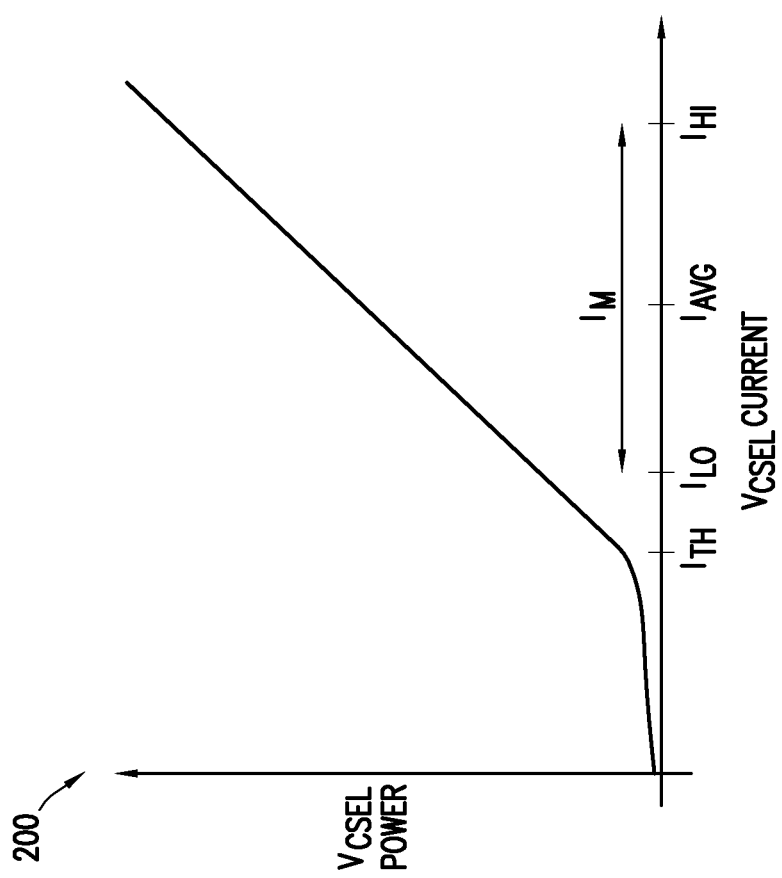
FIG. 2 illustrates a graph depicting the direct-current performance of an example VCSEL, in accordance with the teachings of the present disclosure.

FIG. 2 illustrates a graph 200 depicting the direct-current (DC) performance of an example VCSEL. In particular embodiments, the DC performance of a VCSEL may be characterized by plotting the optical power it may emit for a given current. When a VCSEL is biased below its threshold current, $I_{TH}$, VCSEL may produce negligible optical power. But when VCSEL 106 is biased above $I_{TH}$, VCSEL 106 may generate optical power proportional to the bias current with a proportionality constant η. The constant η may be referred to as the slope efficiency of the VCSEL and may carry units of Watts/Ampere.

In some embodiments, a VCSEL may be driven or modulated at varying levels above $I_{TH}$ in order to transmit information. For example, a VCSEL may be driven at a low current, $I_{LO}$, in order to transmit a logical low, and at a high current, $L_{HI}$, in order to transmit a logical high. The average of $I_{HI}$ and $I_{LO}$ may be referred to as the average DC current ($I_{AVG}$) of VCSEL 106. For example, with a $I_{HI}$ of 7 mA and a $I_{LO}$ of 3 mA, $I_{AVG}$ may be 5 mA. As illustrated in FIG. 2, both $I_{LO}$ and $I_{HI}$ may, in some embodiments, be greater than $I_{TH}$. Graph 200 in FIG. 2 is not necessarily drawn to scale, and in some embodiments where $I_{LO}$ and $I_{HI}$ may be greater than $I_{TH}$, the values of $I_{LO}$ and $I_{HI}$ may be any suitable current values above $I_{TH}$. For the purposes of the present disclosure, the delta between a given $I_{LO}$ and a given $I_{HI}$ may be referred to as a modulation current, $I_M$.

Figure 3:
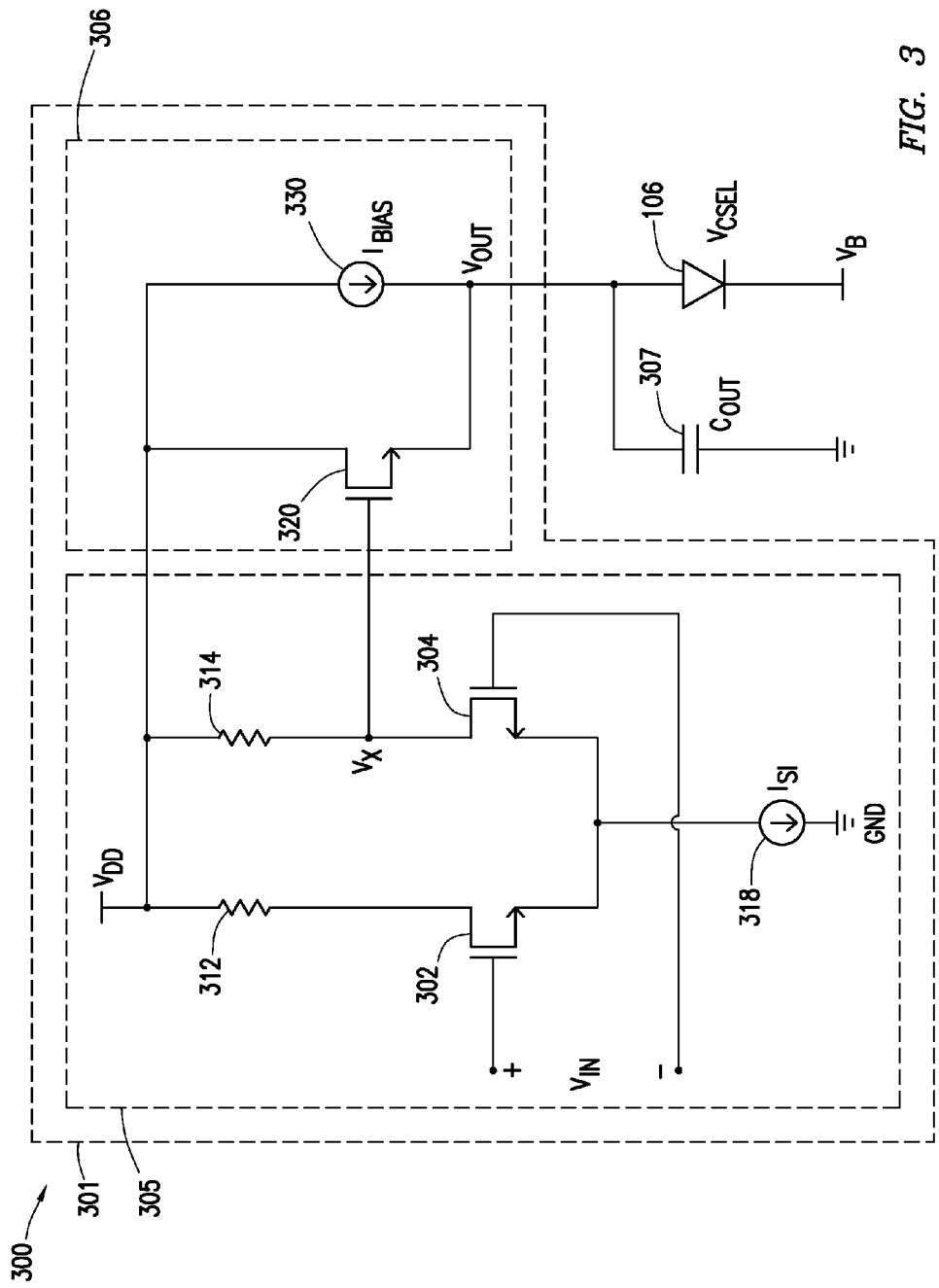
FIG. 3 illustrates a schematic diagram of an example optical transmitter, in accordance with the teachings of the present disclosure.

FIG. 3 illustrates a schematic diagram of optical transmitter 300, in accordance with the teachings of the present disclosure. Optical transmitter 300 may include VCSEL driver 301 and VCSEL 106. In some embodiments, VCSEL driver 301 may include a first stage 305 and an output stage 306. First stage 305 may include N-type metal-oxide semiconductor transistors (NMOS) 302 and 304, resistors 312 and 314, and current source 318. Output stage 306 may include NMOS 320 and current source 330. VCSEL driver 301 may include a low-impedance output, $V_{OUT}$, which may be coupled to VCSEL 106, and may be configured to drive VCSEL 106 with an output voltage. Moreover, VCSEL driver 301 may be configured provide suitable current to VCSEL 106 for a given range of output voltages at $V_{OUT}$.

First stage 305 may operate as an input stage and/or as a gain stage of VCSEL driver 301. In some embodiments, NMOS 302 and NMOS 304 may be configured as a differential pair input. For example, the respective gates of NMOS 302 and NMOS 304 may be coupled to the positive and negative terminals of a differential voltage input, $V_{IN}$. NMOS 302 and NMOS 304 may each have a source that may be coupled to current source 318. For the purposes of the present disclosure, a "current source" may refer to an element that may sink or source a current. Current source 318 may be configured to sink a bias current, $I_{S1}$, which may bias the first stage of VCSEL driver 301. NMOS 302 may have a drain that may be coupled to the power supply line, VDD, through resistor 312. Likewise, NMOS 304 may have a drain that may be coupled to VDD through resistor 314.

The output of first stage 305 of VCSEL driver 301 may comprise the node, $V_X$, between resistor 314 and the drain of NMOS 304. The voltage swing at node $V_X$ across different input voltages at $V_{IN}$ may be controlled based on the current provided by current source 318 and the resistance value of resistor 314. For example, with a positive voltage applied across $V_{IN}$ (e.g. a higher voltage applied to the gate of NMOS 302 than the gate of NMOS 304), the first-stage bias current provided by current source 318 may flow through NMOS 302, and little to no current may flow through NMOS 304 and resistor 314. With little or no current flowing through NMOS 304 and resistor 314, the voltage drop across resistor 314 may be approximately zero volts, and the voltage at node $V_X$ may be approximately equivalent the voltage of VDD. With a negative voltage applied across $V_{IN}$ (e.g., a lower voltage applied to the gate of NMOS 302 than the gate of NMOS 304), the first-stage bias current provided by current source 318 may flow through NMOS 304 and resistor 314. In such a state, the voltage at node $V_X$ may be approximately equivalent to the voltage of VDD minus the voltage drop across resistor 314 caused by the first-stage bias current. Accordingly, the voltage swing at node $V_X$ may be expressed by the following equation:

$$\Delta V_X = R_{314} \times I_{S1} \quad \text{(Eq. One)}$$

where $\Delta V_X$ may be the voltage swing at node $V_X$, $R_{314}$ may be the resistance of resistor 314, and $I_{S1}$ may be the first-stage bias current provided by current source 318. As discussed in greater detail below, $R_{314}$ and $I_{S1}$ may be designed to provided a desired voltage swing at $V_X$, which may in turn correspond to a desired voltage swing at the output of VCSEL driver 301 and a desired modulation current, $I_M$, for VCSEL 106.

Output stage 306 may include NMOS 320 and current source 330. Current source 330 may provide a bias current, $I_{BIAS}$, to VCSEL 106. In some embodiments, $I_{BIAS}$ may be equivalent to $I_{LO}$ as shown in FIG. 2. NMOS 320 may be configured to drive VCSEL 106 with varying levels of additional current. For example, NMOS 320 may modulate the current through VCSEL 106 by alternating between a first state in which it provides no additional current to VCSEL 106 and a second state in which it provides an additional current to VCSEL 106 that may be equivalent to $I_M$ as shown in FIG. 2.

NMOS 320 may be configured as a source-follower, with a drain coupled to VDD, a gate coupled to the output of first stage 305 (e.g., node $V_X$), and a source coupled to $V_{OUT}$. Though the gate of NMOS 320 may be shown in FIG. 2 as being directly coupled to the output of first stage 305 (e.g., node $V_X$), in some embodiments, the gate of NMOS 320 may be coupled indirectly to the output of first stage 305 through one or more intervening components. The voltage drop from the gate of NMOS 320 to the source of NMOS 320 may vary slightly for a large range of drain-to-source currents. Accordingly, the voltage at $V_{OUT}$ may track the voltage at output of the first stage (e.g., node $V_X$) over a wide range of output currents. Because VCSEL driver 301 may be configured to drive the voltage at $V_{OUT}$, VCSEL driver 301 may be referred to herein as a voltage-mode driver.

In some embodiments, VCSEL 106 may have a first terminal coupled to the output of VCSEL driver 301 and a second terminal coupled to a bias voltage $V_B$. The voltage at $V_B$ may be any suitable bias voltage that may provide a sufficient voltage across VCSEL 106 to allow the power level of VCSEL 106 to be modulated. For example, if the VDD power supply for VCSEL driver 301 is sufficiently high (e.g., five volts), $V_B$ may be set to a positive voltage or set to GND. On the other hand, if the VDD power supply for VCSEL driver 301 is, for example, one volt, $V_B$ may be set to a negative voltage to allow a sufficient voltage potential to be established across VCSEL 106 in order to allow the power of VCSEL driver 106 to be modulated.

In the source-follower configuration, NMOS 320 may drive the voltage at $V_{OUT}$ across a range of output currents. For example, the current sunk by VCSEL 106 may increase with an increase in voltage at $V_{OUT}$. Likewise, the current sunk by VCSEL 106 may decrease with a decrease in voltage at $V_{OUT}$. Accordingly, VCSEL driver 301 may modulate the power of VCSEL 106 by increasing and decreasing the voltage of $V_{OUT}$.

The bandwidth that may be achieved by VCSEL driver 301 when driving VCSEL 106 (e.g., modulating the power of VCSEL 106) may be inversely proportional to the capacitance at the output of VCSEL driver 301 and the output impedance of VCSEL driver 301. For example, the bandwidth of VCSEL driver 301 and VCSEL 106 may be expressed as:

$$\text{Bandwidth} = 1/(2\pi \ast R_{OUT} \ast C_{OUT}) \quad \text{(Eq. Two)}$$

where $R_{OUT}$ is the combined impedance at $V_{OUT}$ when VCSEL 106 is coupled to VCSEL driver 301, and $C_{OUT}$ is the capacitance 307 at the output of VCSEL driver 301. In some embodiments, $C_{OUT}$ may be in the range of 300 fF, which may include the parasitic capacitance of VCSEL 106 itself, as well the parasitic capacitance of other devices at the output of VCSEL driver 301, such as an electrostatic-discharge protection device (not expressly shown). $C_{OUT}$ may further include the parasitic capacitance of any routing between VCSEL driver 301 and VCSEL 106, such as the parasitic capacitance of any wiring, pin connection, and/or solder bumps.

$R_{OUT}$ may be a function of the output impedance of VCSEL driver 301 itself and the impedance of VCSEL 106. In some embodiments, the resistance of VCSEL 106 (also referred to herein as the impedance of VCSEL 106) may be approximately 60Ω. $R_{OUT}$ may be equivalent to output impedance of VCSEL driver 301 in parallel with the impedance of VCSEL 106. Accordingly, the impedance at the output of VCSEL driver 301 may be expressed as:

$$R_{OUT}=(R_{DRIVER} \times R_V)/(R_{DRIVER}+R_V) \qquad \text{(Eq. Three)}$$

where $R_{DRIVER}$ is the output impedance of VCSEL driver 301, and $R_V$ is the impedance of VCSEL 106.

As illustrated by the equations two and three above, the bandwidth of a VCSEL and its driver may depend on the output impedance of the driver. For example, drivers that use a gain stage as their output stage as their output stage may have a very large output impedance, $R_{DRIVER}$, as compared to the resistance of a VCSEL (e.g., 60Ω). For such drivers, the value of $R_V$ in parallel with $R_{DRIVER}$ may be approximately equivalent to the value of $R_V$ alone. Thus $R_{OUT}$ may be approximately equivalent to $R_V$. Referring to equation two, systems with a $C_{OUT}$ of 300 fF, an $R_V$ of 60Ω, and a driver with a high output impedance, may have a bandwidth of approximately 8.8 GHz.

The low-impedance output of VCSEL driver 301 may allow VCSEL driver 301 to achieve a high bandwidth (e.g., above 15 GHz). In some embodiments, the source-follower configuration of NMOS 320 in the output stage of VCSEL driver 301 may provide for a low output impedance for VCSEL driver 301. For example, the output impedance VCSEL driver 301 with NMOS 320 configured as a source-follower may be small as compared to a driver incorporating a gain stage with a very large output impedance as its output stage. In some embodiments, the output impedance of VCSEL driver 301 may be expressed as:

$$R_{DRIVER}=1/gm \qquad \text{(Eq. Four)}$$

where gm may be the transconductance of source-follower NMOS 320. The transconductance of NMOS 320 may be affected by the semiconductor process by which NMOS 320 may be made and the ratio of channel width of NMOS 320 to the channel length of NMOS 320.

In some embodiments, the gm of NMOS 320 may be designed to achieve a desired output impedance for VCSEL driver 301, and accordingly, a desired bandwidth for VCSEL driver 301 and VCSEL 106. For example, NMOS 320 may be sized such that 1/gm may be equivalent to the resistance of VCSEL 106 (e.g., $R_{DRIVER}=R_V=60Ω$). Substituting $R_V$ for $R_{DRIVER}$ in equation three may result in an $R_{OUT}$ of one-half $R_V$. Referring to equation two, systems with a $C_{OUT}$ of 300 fF, an $R_V$ of 60Ω, and a VCSEL driver 301 with an output impedance equivalent to the impedance of $R_V$, may have a bandwidth of approximately 17.7 GHz.

Source-follower NMOS 320 may be configured with any suitable gm such that the output impedance (1/gm) of VCSEL driver 301 may meet a given bandwidth requirement. For example, embodiments of VCSEL driver 301 with a bandwidth requirement of less than 17.7 GHz but nonetheless greater than 8.8 GHz (e.g., 13.3 GHz) may be configured with an output impedance greater than 60Ω (e.g., 120Ω). For such embodiments, although the output impedance of VCSEL driver 301 may be greater than the impedance of VCSEL 106, the output impedance of VCSEL driver 301 may nonetheless be small enough to impact the combined impedance at $V_{OUT}$ when VCSEL 106 is coupled to $V_{OUT}$. Moreover, embodiments of VCSEL driver 301 with a bandwidth requirement of more than 17.7 GHz may be configured with an output impedance less than 60Ω (e.g., 5Ω), such that VCSEL driver 210 and VCSEL 106 may achieve a bandwidth of up to and greater than 25 GHz (e.g., 115 GHz).

In some embodiments, the resistance of VCSEL 106 may be greater or lesser than the example 60Ω. Moreover, in some embodiments, the capacitance at the output of VCSEL driver 301 may be greater or lesser than the example 300 fF. As described in equations two and three, such parameters may affect the bandwidth at which VCSEL driver 301 may modulate VCSEL 106. Regardless of the values of $R_V$ and $C_{OUT}$, VCSEL driver 301 may be configured with a source-follower output stage as described above in order to optimize the output impedance of VCSEL driver 301, and thus to optimize the bandwidth achieved by VCSEL driver 301 and VCSEL 106.

In some embodiments, the routing that may couple the output of VCSEL driver 301 to VCSEL 106 (e.g., bond wiring, pin connection, and/or printed-circuit-board path) may have a parasitic resistance. At high frequencies, such routing may act as a resistive transmission line. In order to maximize the power transfer from VCSEL driver 301 to VCSEL 106 and/or to minimize reflections, VCSEL driver 301 may be configured to have an output impedance that may match the output impedance of VCSEL 106. For example, some embodiments of VCSEL driver 301 may be configured with an output impedance of 60Ω to match embodiments of VCSEL 106 having an impedance of 60Ω. Likewise, respective embodiments of VCSEL driver 301 may be configured with output impedances of 50Ω and 70Ω to match respective embodiments of VCSEL 106 having impedances of 50Ω and 70Ω.

The source-follower configuration of NMOS 320 in VCSEL driver 301 may optimize the output impedance of VCSEL driver 301 in a power-efficient manner. As illustrated in FIG. 3, output stage 306 may provide current to VCSEL 106 without driving current through another resistive path from $V_{OUT}$ to $V_B$ or GND. Accordingly, the low impedance output stage of VCSEL driver 301 may achieve a high bandwidth in a more efficient manner than, for example, a driver that achieves a low output impedance, and thus a high bandwidth, by incorporating a low-resistance resistive path from $V_{OUT}$ to $V_B$ or GND in parallel with a VCSEL coupled from $V_{OUT}$ to $V_B$ or GND. As a result, VCSEL driver 301 may not only achieve a high bandwidth, but it may do so in a power-efficient manner.

As described above, the modulation current, $I_M$, provided to VCSEL 106 by VCSEL driver 301 may depend on the voltage swing at $V_{OUT}$ during high and low states, which in turn may depend on the voltage swing at $V_X$ during high and low states. According to equation one, the voltage swing at $V_X$ may depend on the resistor 314 and the first-stage bias current provided by current source 318. Thus, as shown in the equations below, a desired modulation current may be determined based on one or more design parameters for VCSEL driver 301. For example, the overall transconductance of output stage 306 may be expressed as:

$$I_M/\Delta V_X = gm/(1+gm^*R_V). \qquad \text{(Eq. Five)}$$

Substituting equation one into equation five, and solving for $I_M$, results in the following:

$$I_M=(gm^*R_{314}^*I_{S1})/(1+gm^*R_V). \qquad \text{(Eq. Six)}$$

Thus, as shown in equation six, a desired modulation current may be provided based on parameters including the transconductance of NMOS 320 (gm), the resistance of VCSEL 106 ($R_V$) the resistance of resistor 314 ($R_{314}$), and the first-stage bias current of current source 318 ($I_{S1}$).

Figure 4:
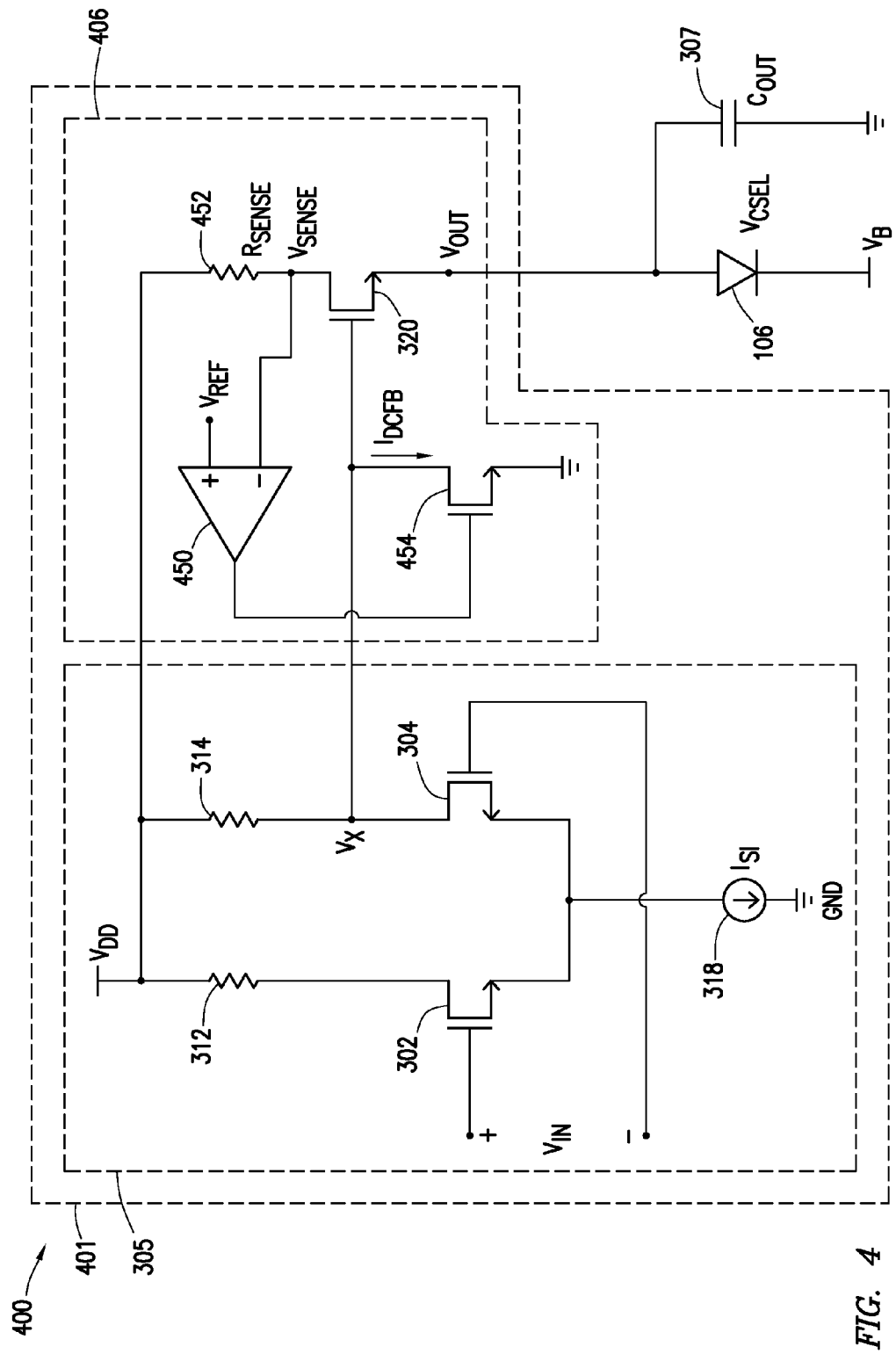
FIG. 4 illustrates a schematic diagram of an example optical transmitter, in accordance with the teachings of the present disclosure.

FIG. 4 illustrates a schematic diagram of an example VCSEL driver 401, in accordance with the teachings of the present disclosure. In some embodiments, VCSEL driver 401 may have a similar first stage 305 as VCSEL driver 301 described above with reference to FIG. 3. VCSEL driver 401 may also have an output stage 406. Similar to output stage 306 of VCSEL driver 301, output stage 406 may include NMOS 320, which may be configured in a source-follower configuration with a gate coupled to $V_X$ and a source coupled to $V_{OUT}$. Accordingly, output stage 406 may provide a low-impedance output capable of modulating VCSEL 106 at high frequencies in a power-efficient manner as described above with reference to FIG. 3. In addition, output stage 406 may include a feedback loop that may be configured to set the DC bias voltage of node $V_X$. Accordingly, the feedback loop may control the average VCSEL current, $I_{AVG}$, about which the high-frequency $I_M$ current may be modulated.

In some embodiments, output stage 406 may include sense resistor 452 coupled between VDD and the drain of source-follower NMOS 320. The node coupling sense resistor 452 and the drain of source-follower NMOS 320 may be referred to as $V_{SENSE}$. The voltage at $V_{SENSE}$ may correspond to the output current of output stage 406, and may be compared to a reference voltage, $V_{REF}$. For example, amplifier 450 may have a positive input terminal coupled to $V_{REF}$ and a negative input terminal coupled to $V_{SENSE}$. The voltage of $V_{REF}$ may be set at any suitable level depending on the desired average DC output current ($I_{AVG}$). For example, VDD may substantially equal 1V and sense resistor 452 may have a resistance of 50Ω. For a desired average DC current ($I_{AVG}$) of 5 mA, the voltage drop across sense resistor 452 may be 250 mV. Accordingly, $V_{REF}$ may be set to 0.75V (i.e., 250 mV below the VDD of 1V). The output of amplifier 450 may drive a current source coupled to the gate of NMOS 320. For example, amplifier 450 may have an output coupled to the gate of NMOS 454, which may have a source coupled to GND and a drain coupled to the gate of NMOS 320 (e.g., to node $V_X$).

In some embodiments, first stage 305 may be configured such that, in the absence of the feedback loop in output stage 406, the DC voltage at node $V_X$ may drive NMOS 320 at a current higher than the desired average DC output current. Accordingly, the feedback loop of output stage 406 may intervene to pull the DC output current down to a desired level. For example, if the average DC output current is larger than the desired DC output current, $V_{REF}$ may be higher than $V_{SENSE}$, amplifier may drive the gate of NMOS 454 high, and NMOS 454 may pull down on the gate of source-follower NMOS 320 until the DC output current settles to the desired level (e.g., 5 mA).

Figure 5:
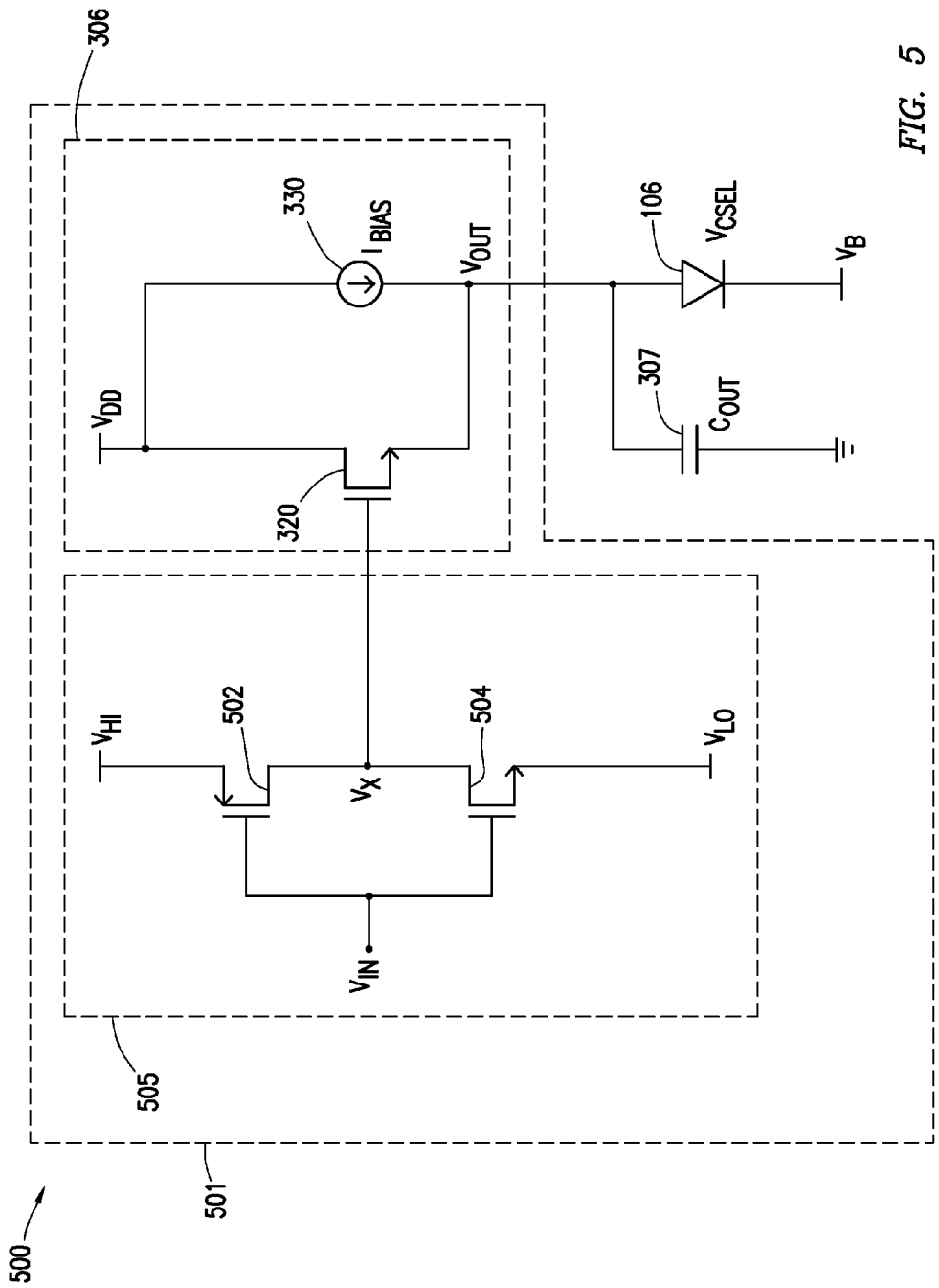
FIG. 5 illustrates a schematic diagram of an example optical transmitter, in accordance with the teachings of the present disclosure.

FIG. 5 illustrates a schematic diagram of a VCSEL driver 501, in accordance with the teachings of the present disclosure. Similar to VCSEL driver 301 described above with reference to FIG. 3, VCSEL driver 501 may include output stage 306 which may include NMOS 320 configured in a source-follower configuration. Accordingly, VCSEL driver 501 may include a low-impedance output capable of modulating VCSEL 106 at high frequencies in a power-efficient manner as described above with reference to FIG. 3. In addition, VCSEL driver 501 may include first stage 505. First stage 505 may include PMOS 502 and NMOS 504. In some embodiments, PMOS 502 and NMOS 504 may be configured as an inverter. For example, PMOS 502 may have a gate coupled to a single-ended input $V_{IN}$, a drain coupled to the first-stage output node $V_X$, and a source coupled to a high voltage supply $V_{HI}$. Further, NMOS 504 may have a gate coupled to $V_{IN}$, a drain coupled to the first-stage output node $V_X$, and a source coupled to a low voltage supply $V_{LO}$. Accordingly, when $V_{IN}$ is driven high, first stage 505 may drive $V_X$ low to the voltage of $V_{LO}$. And when $V_{IN}$ is driven low, first stage 505 may drive $V_X$ high to the voltage of $V_{HI}$. For the purpose of the present disclosure, first stage 505 may also be referred to as an input stage. Moreover, because an inverter formed by PMOS 502 and NMOS 504 may have a DC gain between the $V_{HI}$ and $V_{LO}$ power-supply rails, first stage 505 may also be referred to herein as a gain stage.

The voltage of $V_{HI}$ may be set to any suitable voltage to drive the gate of source-follower NMOS 320 during a logical high state for VCSEL 106. For example, the voltage of $V_{HI}$ may be equivalent to the voltage potential of VDD. Similarly, the voltage of $V_{LO}$ may be set to any suitable voltage to drive the gate of source-follower NMOS 320 during a logical low state for VCSEL 106. For example, the voltage of $V_{LO}$ may be equivalent to the voltage of VB or GND. In some embodiments, the respective voltage potentials of $V_{HI}$ and $V_{LO}$ may be regulated to particular voltage levels that correspond to a desired modulation current. For example, the voltage potential of $V_{HI}$ may be regulated to a level such that when NMOS 320 is driven at its gate with the voltage of $V_{HI}$, NMOS 320 may combine with current source 330 to provide a current of $I_{HI}$ to VCSEL 106. Similarly, the voltage potential of $V_{LO}$ may be regulated to a level such that when NMOS 320 is driven at its gate with the voltage of $V_{LO}$, NMOS 320 may combine with current source 330 to provide a desired low current of $I_{LO}$ to VCSEL 106. VCSEL drivers 301, 401, and 501 may be implemented in any suitable semiconductor process. For example, VCSEL drivers 301, 401, and 501 may be implemented in a complementary metal-oxide semiconductor process (CMOS), a bipolar process, a Bi-CMOS process, or any other suitable process. Although various transistors in VCSEL drivers 301, 401, and 501 may be illustrated as either PMOS or NMOS transistors, such transistors may be replaced in a bipolar process with P-type bipolar junction transistors (PNP BJTs) and/or N-type bipolar junction transistors (NPN BJTs). For example, in some embodiments, source-follower NMOS 320 may be replaced by an NPN BJT. In such embodiments, the NPN BJT may be configured in an emitter-follower configuration similar to the source-follower configuration of NMOS 320. Because emitter-followers have a low output impedances similar to the low output-impedances of source-follower NMOS transistors, embodiments implementing an emitter-follower NMOS may achieve similar bandwidths and efficiencies as embodiments of VCSEL driver 301 implementing an NMOS source-follower. Though VCSEL drivers 301, 401, and 501 may be implemented with an NMOS source-follower as shown in FIGS. 3-5, in some embodiments, VCSEL drivers 301, 401, and 501 may include a PMOS source-follower. For example, in some embodiments, VCSEL 106 may be coupled between a high potential voltage supply and the output of the VCSEL driver. For such embodiments, the output stage of the VCSEL driver may include a PMOS source-follower having a drain coupled to GND and a source coupled to the output of the VCSEL driver. Likewise, the output stage of such VCSEL drivers may include a PNP BJT emitter-follower having a collector coupled to GND and an emitter coupled to the output of the VCSEL driver. Because PMOS source-followers and PNP BJT emitter-followers may have low output impedances, such embodiments may achieve similar bandwidths and efficiencies as embodiments of VCSEL drivers 301, 401, and 501 having an NMOS source-follower. This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions has been described in detail, it should be understood that the various changes, substitutions, and alterations could be made hereto without departing from the spirit and scope of the invention.

What is claimed is:

1. An optical transmitter, comprising:
   a vertical-cavity surface-emitting laser (VCSEL); and
   a VCSEL driver comprising:
   an input stage configured to receive a voltage signal; and
   a low-impedance output stage configured to drive the VCSEL with wiring capacitance coupled thereto, the low-impedance output stage comprising:
   an input coupled to the input stage;
   a transistor in a follower configuration having a follower node coupled to the VCSEL and configured to provide a modulated output current to the VCSEL; and
   a current source coupled between a power supply and the follower node of the transistor and configured to provide a current above a threshold current of the VCSEL.

2. The optical transmitter of claim 1, wherein the output stage comprises a metal-oxide semiconductor field-effect transistor (MOSFET) in a source-follower configuration.

3. The optical transmitter of claim 2, wherein the MOSFET is an N-type MOSFET.

4. The optical transmitter of claim 1, wherein the output stage comprises an bipolar junction transistor (BJT) in an emitter-follower configuration.

5. The optical transmitter of claim 1, wherein the output impedance of the output stage is in a range of approximately five to approximately one-hundred-and-twenty ohms.

6. The optical transmitter of claim 1, wherein the output impedance of the output stage matches the impedance of the VCSEL.

7. The optical transmitter of claim 1, wherein the VCSEL driver is configured to modulate the output current at a frequency of at least approximately 15 GHz.

8. The optical transmitter of claim 2, wherein the input stage is configured to modulate a voltage at the gate of the MOSFET across a controlled voltage range.

9. The optical transmitter of claim 1, wherein the input stage comprises an inverter configured to receive the voltage signal and to drive the input of output stage.

10. A vertical-cavity surface-emitting laser (VCSEL) driver, comprising:
    an input stage configured to receive a voltage signal; and
    low-impedance output stage comprising:
    an input coupled to the input stage;
    a transistor in a follower configuration having a follower node configured to provide a modulated output current to a VCSEL when coupled to the VCSEL; and
    a current source coupled between a power supply and the follower node of the transistor and configured to provide a current above a threshold current of the VCSEL.

11. The VCSEL driver of claim 10, wherein the output stage comprises a metal-oxide semiconductor field-effect transistor (MOSFET) in a source-follower configuration.

12. The VCSEL driver of claim 11, wherein the MOSFET is an N-type MOSFET.

13. The VCSEL driver of claim 10, wherein the output stage comprises a bipolar junction transistor (BJT) in an emitter-follower configuration.

14. The VCSEL driver of claim 13, wherein the BJT is an N-type BJT.

15. The VCSEL driver of claim 10, wherein the output impedance of the output stage is in a range of approximately five to approximately one-hundred-and-twenty ohms.

16. The VCSEL driver of claim 10, wherein the VCSEL driver is configured to modulate the output current at a frequency of at least approximately 15 GHz.

17. The VCSEL driver of claim 11, wherein the input stage is configured to modulate a voltage at the gate of the MOSFET across a controlled voltage range.

18. The VCSEL driver of claim 10, wherein the input stage comprises an inverter configured to receive the voltage signal and to drive the input of output stage.

19. A vertical-cavity surface-emitting laser (VCSEL) driver, comprising:
    an input stage configured to receive a voltage signal;
    low-impedance output stage comprising:
    an input coupled to the input stage; and
    a low-impedance output configured to provide a modulated output current to a VCSEL when coupled to the VCSEL; and
    a feedback loop configured to control the average current of the modulated output current, the feedback loop comprising:
    a sense resistor coupled in series with an output stage transistor;
    an amplifier coupled to the sense resistor and configured to sense the modulated output current; and
    a transistor driven by the amplifier and configured to apply a feedback current to the input of the output stage.

20. The VCSEL driver of claim 19, wherein the output stage comprises a metal-oxide semiconductor field-effect transistor (MOSFET) in a source-follower configuration.

21. The VCSEL driver of claim 20, wherein the MOSFET is an N-type MOSFET.

22. The VCSEL driver of claim 19, wherein the output stage comprises a bipolar junction transistor (BJT) in an emitter-follower configuration.

23. The VCSEL driver of claim 22, wherein the BJT is an N-type BJT.

* * * * *